United States Patent [19]
Nozaki et al.

[11] Patent Number: 5,506,088
[45] Date of Patent: Apr. 9, 1996

[54] CHEMICALLY AMPLIFIED RESIST COMPOSITION AND PROCESS FOR FORMING RESIST PATTERN USING SAME

[75] Inventors: Koji Nozaki; Ryosuke Tokutomi; Yuko Kaimoto; Satoshi Takechi, all of Kawasaki, Japan

[73] Assignee: Fujitsu Limited, Kawasaki, Japan

[21] Appl. No.: 336,234

[22] Filed: Nov. 3, 1994

Related U.S. Application Data

[63] Continuation of Ser. No. 942,601, Sep. 10, 1992, abandoned.

[30] Foreign Application Priority Data

Sep. 17, 1991 [JP] Japan .................................. 3-235253
Sep. 19, 1991 [JP] Japan .................................. 3-239872

[51] Int. Cl.$^6$ ...................................................... G03C 1/73
[52] U.S. Cl. .................. 430/270.1; 430/296; 430/326; 430/942
[58] Field of Search ...................................... 430/296, 326, 430/942, 270

[56] References Cited

U.S. PATENT DOCUMENTS

| | | | |
|---|---|---|---|
| 4,491,628 | 1/1985 | Ito et al. | 430/176 |
| 5,073,474 | 12/1991 | Schwalm et al. | 430/270 |
| 5,213,919 | 5/1993 | Kuwakubo et al. | 430/49 |
| 5,350,660 | 9/1994 | Urano et al. | 430/176 |

FOREIGN PATENT DOCUMENTS 2-27660  6/1990  Japan .

*Primary Examiner*—Jeffrey Mullis
*Attorney, Agent, or Firm*—Armstrong, Westerman, Hattori, McLeland & Naughton

[57] ABSTRACT

Improved chemically amplified resist is provided that comprises 100 parts by weight of a copolymer produced from a first monomer unit having a recurrent acid labile pendant group that changes the polarity of the polymer and a second monomer unit having an alkali-soluble group and 1 to 20 parts by weight of a photo acid generator.

4 Claims, 1 Drawing Sheet

CHEMICALLY AMPLIFIED RESIST COMPOSITION AND PROCESS FOR FORMING RESIST PATTERN USING SAME

This application is a continuation of application Ser. No. 07/942,601, filed Sep. 10, 1992, now abandoned.

BACKGROUND OF THE INVENTION

1. Field of the Invention

The present invention relates to a chemically amplified resist composition and a process for forming a resist pattern by using the same.

2. Description of Related Art

As trends for higher circuit density in microelectronic devices continue, the light source for exposing to a resist film so as to form a fine pattern was originally an ultra-violet but has been shifted to shorter wave length radiation using deep ultra-violet, electron beam X-ray.

In deep ultra-violet lithography, sources may be a high pressure mercury lamp or an excimer laser, but the high pressure mercury lamp has a disadvantageously low output in the wave length range of deep ultra-violet. Accordingly, excimer laser (for example, a wave length of 248 nm when KrF gas is used) is being mainly used in the investigation of a shorter wave length lithography because of high output.

Nevertheless, conventional resists based on a novolak resin using deep ultra violet radiation results in sloped wall profiles and poor resolution because the conventional resist absorbs too much in the deep ultra-violet region.

Accordingly, attempts are being made to provide a resist having excellent sensitivity and high resolution at such a short wave length.

To cope with the above demands, a process for forming a resist pattern has been proposed by IBM using a photo acid generator that generates stong acid upon exposure to radiation in an imagewise configuration. The resist composition contains a photo acid generator in combination with a polymer having a recurrent acid labile pendant. When the resist composition is exposed to radiation, a Bronsted acid is generated from the photo acid generator during the post exposure baking, and will act as a catalyst for successively cleaving the polymer recurrent acid labile pendant groups and changing the polarity of the polymers. The obtained polymers can be developed with an alkali that allows high resolution and does not cause swelling (U.S. Pat. No. 4,491,628 or Japanese Patent Application No. 02-27660). This type of resist is called a chemically amplified resist.

This resist contains a recurrent acid labile pendant group to change the polarity of the polymer and therefore a high sensitivity can be expected using a chemically amplified resist system. The system is a means of improving transparency because such a system requires little of the photosensitive compound as a catalyst.

Nevertheless, resist patterns obtained by the chemically amplified resist as above often have a T-shaped form 1 (a surface inhibition layer 2) as shown in FIG. 1. This T-shaped pattern renders the pattern width uneven and the pattern or the device unreliable.

Moreover, the chemically amplified resists often have poor adhesivity to a substrate, which makes the formation of a fine pattern difficult, i.e., lowers the resolution. It is therefore difficult to reliably form submicron patterns by a chemically amplified resist.

The object of the present invention is to provide a chemically amplified resist having a high resolution and forming no T-shaped patterns.

SUMMARY OF THE INVENTION

The above object of the present invention is attained by providing a chemically amplified resist composition comprising 100 parts by weight of a copolymer produced from a first monomer unit having a recurrent acid labile pendant group to change the polarity of the first monomer unit and a second monomer unit having an alkali-soluble group and 1 to 20 parts by weight of a photo acid generator.

The present invention also provides a process for forming a resist pattern, comprising the steps of coating a chemically amplified resist composition on a substrate, baking before exposure, exposing the chemically amplified resist composition to radiation in an imagewise configuration, post exposure baking, developing the exposed chemically amplified resist composition with an alkali-solution to form a resist pattern, wherein said chemically amplified resist composition comprises 100 parts by weight of a copolymer of a first monomer unit having a recurrent acid labile pendant group to change the polarity of the first monomer unit and a second monomer unit having an alkali-soluble group and 1 to 20 parts by weight of a photo acid generator.

DETAILED DESCRIPTION OF THE INVENTION

Figure 1:
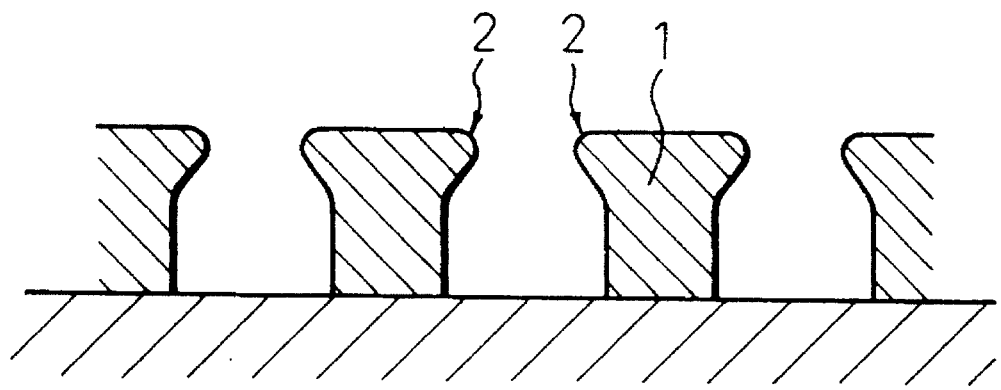
FIG. 1 shows a T-shaped pattern obtained from a conventional chemically amplified resist.

The photo acid generator that may be used in the present invention is any one of the known photo acid generators, including triaryl sulfonium salts such as triphenylsulfonium hexafluoroantimonate and triphenylsulfonium hexafluoroarsenate, diaryliodonium salts such as diphenyliodonium hexafluoroantimonate and diphenyliodonium hexafluoroarsenate, and sulfonates such as benzointosylate and phenyl p-toluenesulfonate, halides such as hexachlorobenzene and 2,4-bis(trichloromethyl)-6 -(p-methoxyphenyl)-1,3,5-triazine, and the like.

The photo acid generator is generally used in an amount of 1 to 20% by weight, preferably 2–3 to 10% by weight, based on 100 parts by weight of the polymer.

The first monomer unit in the copolymer is based on the principle of acid catalyzed polymer deprotection reactions and may be the same as polymers used in any known conventional chemically amplified resists. The first monomer unit can be exemplified by tert-butyl methacrylate, 1,1'-dimethyl-benzyl methacrylate, 4-tert-butoxycarbonyloxystyrene, tetrahydropyranyl methacrylate, tetrahydropyranyloxystyrene, etc.

In accordance with the present invention, a polymer containing the first monomer unit is copolymerized with a second monomer having an alkali-soluble group. In this specification, the term "alkali-soluble group" means that a homopolymer made of a second monomer having said group is alkali-soluble. Suitable alkali-soluble groups for the purpose of the present invention are hydroxyl, carboxyl, methoxy and acid anhydride groups, particularly hydroxyl and carboxyl.

It is said that the formation of the inhibition layer (T-shaped patterns) is mainly caused by the photogenerated acid being neutralized by the airborne organic base. The present inventors considered that the formation of the inhibition layer is also attributed to the surface of the spin-coated resist film which is made hydrophobic. If the surface portion of the resist is made hydrophobic, the surface portion of the resist repels an alkali-developer and is difficult to be developed, which results in the formation of a T-shaped pattern. Therefore, an alkali-soluble group is introduced to the polymer to prevent the surface of the polymer from being made hydrophobic and successful results are obtained, i.e., the inhibition layer (pent roof) of the pattern disappears.

The alkali-soluble group can be introduced to the polymer by copolymerizing the first monomer having recurrent acid labile pendant group with a monomer having an alkali-soluble group, i.e., the second monomer. The second monomer may be any compound that can be copolymerized with the first monomer and has an alkali-soluble group. Suitable examples of the second monomer include

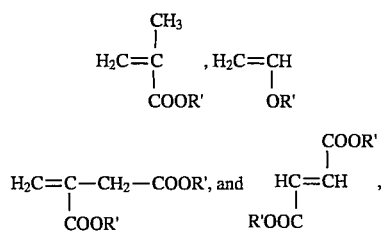

wherein R' stands for hydrogen, methyl, etc.

The second monomer unit should be more than 1% by mole and less than 30% by mole of the copolymer. If the second monomer unit is too little, the desired effects cannot be obtained, and if it is too much, the copolymer becomes too soluble in an alkali and even unexposed area will be solved. A preferred range of the amount of the second monomer unit is 5 to 15% by mole of the copolymer.

Further, it was also found that the polymer containing the first monomer unit can be made more adhesive to a substrate by introducing the alkali-soluble group, preferably hydroxyl and/or carboxyl groups, particularly hydroxyl group, and the formation of a fine pattern or an enhancement of resolution can be attained. It was also found that a methacrylate represented by the following formula:

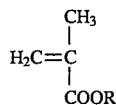

where R stands for an alkyl group having 2 to 4 carbon atoms in which one hydrogen atom is substituted with one hydroxyl group, for example, hydroxyl ethyl methacrylate, is a suitable monomer to be copolymerized with the first monomer so as to improve the adhesivity of the polymer.

The amount of the second monomer unit should be less than 30% by mole to maintain the sensitivity of the polymer.

The chemically amplified resist composition of the present invention can be coated on a substrate, prebaked, exposed to radiation in an imagewise configuration, particularly deep ultra-violet or an electron beam, post baked, and developed with an alkaline developer, in a manner known in the art.

EXAMPLES

Comparable Example 1

A resist solution was made by adding 100 parts by weight of polytert-butylmethacrylate and 10 parts by weight of triphenylsulfonium hexafluoroantimonate in methylcellosolve acetate (MCA) to form a 20% solution.

The resist solution was spin-coated on a Si substrate and baked at 100° C. for 20 minutes to form a resist layer having a thickness of 1 μm.

The resist layer was exposed using a KrF excimer stepper (NA 0.37), baked at 100° C. for 60 seconds and then developed with a 2.38% tetramethylammoniumhydroxide (TMAH) aqueous solution for 1 minute.

The obtained resist pattern had 0.5 μm lines and spaces but had a T-shaped form, i.e., having an inhibition layer (a pent roof) about 0.2 μm in width.

Example 1 (—COOH)

A copolymer of tert-butyl methacrylate and methacrylic acid was prepared.

A 200 ml Erlenmeyer flask with a magnetic stirring bar was charged with following ingredients and stirred under a nitrogen atmosphere at 60° C.

| | |
|---|---|
| tert-butyl methacrylate | 8.3 g (59 m mol) |
| methacrylic acid | 3.6 g (41 m mol) |
| azobisisobutylonitrile (AIBN) | 16.3 g (100 m mol) |
| chlorobenzene | 77.7 ml |

After 7 hours stirring, the reaction mixture was added dropwise to 2 l of hexane with stirring. The precipitated polymer was separated, filtered with a glass filter and dried at 40° C. under 0.1 mmHg for 4 hours. The polymer was dissolved in 20 ml chlorobenzene, which was reprecipitated in 2 l of hexane, filtered and dried at 40° C. under 0.1 mmHg for 20 hours. The yield of the copolymer was 4.3 g (36%).

The weight average molecular weight was 32300 and the dispersion was 1.86. The polymer was 99.5:0.5 copolymer of tert-butylmethacrylate and methacrylic acid.

100 parts by weight of the tert-butylmethacrylate/methacrylic acid copolymer and 10 parts by weight of triphenyl sulfonium hexafluoroantimonate were added in methylcellosolveacetate (MCA) to form a 20% MCA solution.

Thus prepared resist solution was spin-coated on a Si substrate and baked at 100° C. for 20 minutes to form a resist layer 1 μm thick.

The resist layer was exposed using a KrF excimer stepper (NA 0.37), baked at 100° C. for 60 seconds and then developed with a 2.38% tetramethylammoniumhydroxide (TMAH) aqueous solution for 30 seconds.

Figure 2:
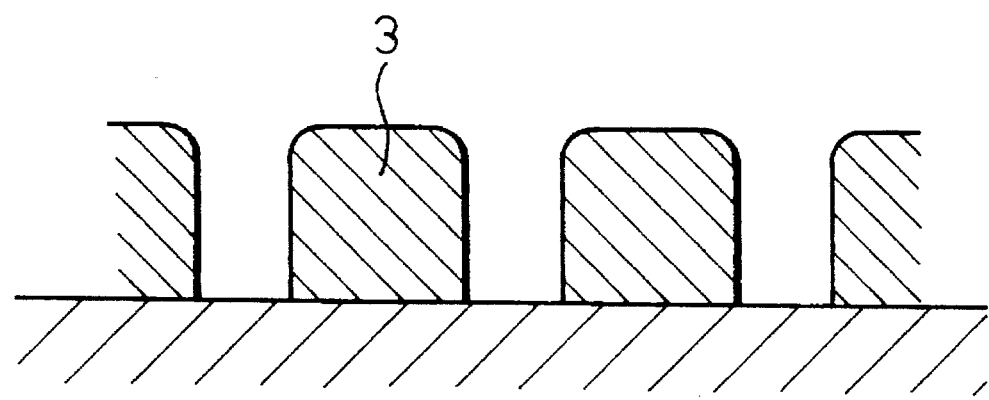
FIG. 2 shows a resist pattern obtained in accordance with the present invention.

The obtained resist pattern 3 had 0.4 μm lines and spaces and did not have an inhibition layer, as shown in FIG. 2.

Example 2 (acid anhydride group)

A copolymer of tert-butyl methacrylate and maleic anhydride was prepared.

A 200 ml Erlenmeyer flask with a magnetic stirring bar was charged with following ingredients and stirred under a nitrogen atmosphere at 60° C.

| tert-butyl methacrylate | 5.7 g (40 m mol) |
| maleic anhydride | 5.9 g (60 m mol) |
| AIBN | 493 mg (3 m mol, 3 mol %) |
| toluene | 40 ml |

After 9 hours stirring, the reaction mixture was added dropwise to 2 l of hexane with stirring. The precipitated polymer was separated, filtered with a glass filter and dried at 40° C. under 0.1 mmHg for 4 hours. The polymer was dissolved in 10 ml of tetrahydrofuran, which was reprecipitated in 2 l of hexane, filtered and dried at 40° C. under 0.1 mmHg for 18 hours.

The yield of the copolymer was 7.2 g (62%). The weight average molecular weight was 12000 and the dispersion was 1.72. The polymer was 90:10 copolymer of tert-butyl methacrylate and maleic anhydride.

100 parts by weight of the tert-butylmethacrylate/maleic anhydrous copolymer and 10 parts by weight of triphenylsulfoniumhexafluoro antimonate were added in methylcellosolveacetate to form a 20% MCA solution.

The prepared resist solution was spin-coated on a Si substrate and baked at 100° C. for 20 minutes to form a resist layer 1 μm thick.

The resist layer was exposed using a KrF excimer stepper (NA 0.37), baked at 100° C. for 60 seconds and then developed with a 2.38% tetramethylammoniumhydroxide aqueous solution for 1 minute.

The obtained resist pattern had 0.4 μm lines and spaces and did not have an inhibition layer.

Example 3 (—OH)

A copolymer of tert-butyl methacrylate and vinyl alcohol was prepared. A 100 ml Erlenmeyer flask with a magnetic stirring bar was charged with following ingredients and stirred under a nitrogen atmosphere at 60° C.

| tert-butyl methacrylate | 4.8 g (34 m mol) |
| vinyl acetate | 5.6 g (66 m mol) |
| azobisisobutylonitrile (AIBN) | 493 g (3 m mol, 3 mol %) |

After 10 hours stirring, the reaction mixture was dissolved in 50 ml acetone.

The acetone solution was added dropwise to 2 l of hexane with stirring. The precipitated polymer was separated, filtered with a glass filter and dried at 40° C. under 0.1 mmHg for 4 hours. The polymer was dissolved in 20 ml THF/methanol, which was added to $K_2CO_3$/aq methanol, stirred for 1 hour, filtered and dried at 40° C. under 0.1 mmHg for 16 hours.

The yield of the copolymer was 3.2 g (31%). The weight average molecular weight was 9800 and the dispersion was 1.92. The polymer was 72:28 copolymer of tert-butyl methacrylate and vinyl alcohol. The obtained resist pattern had 0.4 μm lines and spaces and did not have a surface inhibition layer.

Comparable Example 1

A copolymer of tert-butyl methacrylate and vinyl alcohol was prepared. A 100 ml Erlenmeyer flask with a magnetic stirring bar was charged with following ingredients and stirred under a nitrogen atmosphere at 60° C.

| tert-butyl methacrylate | 2.6 g (18 m mol) |
| vinyl acetate | 7.1 g (82 m mol) |
| azobisisobutylonitrile (AIBN) | 493 g (3 m mol, 3 mol %) |

After 10 hours stirring, the reaction mixture was dissolved in 50 ml acetone.

The acetone solution was added dropwise to 2 l hexane with stirring. The precipitated polymer was separated, filtered with a glass filter and dried at 40° C. under 0.1 mmHg for 4 hours. The polymer was dissolved in 20 ml THF/methanol, which was added to $K_2CO_3$/aq methanol, stirred for 1 hour, filtered and dried at 40° C. under 0.1 mmHg for 16 hours. The yield of the copolymer was 3.8 g (39%). The weight average molecular weight was 10200 and the dispersion was 1.89. The polymer was 60:40 copolymer of tert-butyl methacrylate and vinyl alcohol.

100 parts by weight of the tert-butylmethacrylate/vinyl alcohol copolymer and 10 parts by weight of triphenylsulfonium hexafluoroantimonate were added in methylcellosolveacetate (MCA) to form a 20% MCA solution.

Thus prepared resist solution was spin-coated on a Si substrate and baked at 100° C. for 20 minutes to form a resist layer 1 μm thick.

The resist layer was exposed using a KrF excimer stepper (NA 0.37), baked at 100° C. for 60 seconds and then developed with a 2.38% tetramethylammoniumhydroxide (TMAH) aqueous solution for 30 seconds.

As a result, the unexposed area was dissolved and a fine resist pattern was not obtained.

Example 4

A copolymer of tert-butyl methacrylate and 2-hydroxyethyl methacrylate was prepared.

A 100 ml Erlenmeyer flask with a magnetic stirring bar was charged with the following ingredients and stirred under a nitrogen atmosphere at 75° C.

| tert-butyl methacrylate | 10.0 g (70.3 m mol) |
| 2-hydroxyethyl methacrylate | 915 mg (7 m mol) |
| azobisisobutylonitrile (AIBN) | 508 mg (3.1 m mol, 4 mol %) |
| toluene | 15.5 ml |

After 5 hours stirring, the reaction mixture was added dropwise to 4 l of hexane with stirring. The precipitated polymer was separated, filtered with a glass filter and dried at 40° C. under 0.1 mmHg for 6 hours. The polymer was dissolved in 10 ml of tetrahydrofuran, which was reprecipitated in 2 l of hexane, filtered and dried at 40° C. under 0.1 mmHg for 16 hours.

The yield of the copolymer was 8.5 g (78%). The weight average molecular weight was 34000 and the dispersion was 1.56, and the composition of the polymer was 88:12 copolymer of tert-butyl methacrylate and 2-hydroxyethyl methacrylate.

100 parts by weight of the obtained copolymer was added with 1 part by weight of benzoin tosylate and dissolved in ethyl lactate to form a 13% resist solution.

The resist solution was spin-coated on a hexamethyldisilazane (HMDS)-treated Si substrate and baked at 100° C. for 20 minutes to form a resist layer 1 μm thick.

The resist layer was exposed using an electron beam exposure unit at an acceleration voltage of 20 kV and then developed with a 2.38% tetramethylammoniumhydroxide (TMAH) aqueous solution for 60 seconds.

As a result, the resist patterns of 0.6 μm line-and-space pattern were resolved and the sensitivity was 2.3 μC/cm².

The same resist solution was coated on a Si substrate that was not treated with HMDS and processed in the same manner as above. The results were similar to the above and the resist patterns were not peeled off.

Example 5

A copolymer of 1,1-dimethylbenzyl methacrylate and 2-hydroxyethyl methacrylate was prepared.

A 100 ml Erlenmeyer flask with a magnetic stirring bar was charged with the following ingredients and stirred under a dry nitrogen atmosphere at 75° C.

| 1,1-dimethylbenzyl methacrylate | 20.0 g (89.8 m mol) |
| 2-hydroxyethyl methacrylate | 1.16 g (9 m mol) |
| azobisisobutylonitrile (AIBN) | 324 mg (2.0 m mol, 2 mol %) |
| toluene | 19.8 ml |

After 5 hours stirring, the reaction mixture was added dropwise to 4 l of hexane while stirring. The precipitated polymer was separated, filtered with a glass filter and dried at 40° C. under 0.1 mmHg for 6 hours. The polymer was dissolved in 15 ml of tetrahydrofuran, which was reprecipitated in 3 l of hexane, filtered and dried at 40° C. under 0.1 mmHg for 16 hours.

The yield of the copolymer was 15 g (87%). The weight average molecular weight was 72000 and the dispersion was 1.73. The composition of the copolymer was 90:10 copolymer of 1,1-dimethylbenzyl methacrylate and 2-hydroxyethyl methacrylate.

100 parts by weight of the obtained copolymer was added with 1 part by weight of triphenyl sulfonium hexafluora antimonate and dissolved in ethyl lactate to form a 12% resist solution.

The resist solution was spin-coated on a hexamethyldisilazane (HMDS)-treated Si substrate and baked at 100° C. for 20 minutes to form a resist layer 1 μm thick.

The resist layer was exposed using an electron beam at an acceleration voltage of 20 kV and then developed with a 2.38% tetramethylammoniumhydroxide (TMAH) aqueous solution for 60 seconds.

As a result, the resist patterns of the 0.8 μm line-and-space pattern were resolved and the sensitivity was 3.5 μC/cm².

The same resist solution was coated on a Si substrate that was not treated with HMDS and processed in the same manner as above. The results were similar to the above and the resist patterns were not peeled off.

Example 6

A copolymer of tetrahydropyranyl methacrylate and 2-hydroxyethyl methacrylate was prepared.

A 100 ml Erlenmeyer flask with a magnetic stirring bar was charged with the following ingredients and stirred under a nitrogen atmosphere at 75° C.

| tetrahydropyranyl methacrylate | 10.0 g (58.8 m mol) |
| 2-hydroxyethyl methacrylate | 770 g (5.9 m mol) |
| azobisisobutylonitrile (AIBN) | 212 mg (1.3 m mol, 2 mol %) |
| toluene | 26 ml |

After 5 hours stirring, the reaction mixture was added dropwise 4 l of hexane while stirring. The precipitated polymer was separated, filtered with a glass filter and dried at 40° C. under 0.1 mmHg for 6 hours. The polymer was dissolved in 20 ml of tetrahydrofuran, which was reprecipitated in 3 l of hexane, filtered and dried at 40° C. under 0.1 mmHg for 16 hours.

The yield of the copolymer was 9.5 g (88%). The weight average molecular weight was 54000 and the dispersion was 1.66. The composition of the copolymer was 90:10 copolymer of tetrahydropyranyl methacrylate and 2-hydroxyethyl methacrylate.

100 parts by weight of the obtained copolymer was added with 5 parts by weight of benzoin tosylate and dissolved in methyl cellosolve acetate (MCA) to form a 13% resist solution.

The resist solution was spin-coated on a hexamethyldisilazane (HMDS)-treated Si substrate and baked at 100° C. for 20 minutes to form a resist layer 1 μm thick.

The resist layer was exposed using a KrF excimer lash stepper with a numeral aperture (NA) of 0.37 and then developed with a 2.38% tetramethyl ammonium hydroxide (TMAH) aqueous solution for 60 seconds.

As a result, the resist patterns of the 0.5 μm line-and-space pattern were resolved and the sensitivity was 35 mJ/cm².

The same resist solution was coated on a Si substrate that was not treated with HMDS and processed in the same manner as above. The results were similar to the above and the resist patterns were not peeled off.

Example 7

A copolymer of 4 tert-butylcarbonyloxystyrene and 2-hydroxyethyl methacrylate was prepared.

A 100 ml Erlenmeyer flask with a magnetic stirring bar was charged with the following ingredients and stirred under nitrogen atmosphere at 75° C.

| 4-tert-butylcarbonyloxystyrene | 20.0 g (90.8 m mol) |
| 2-hydroxyethyl methacrylate | 1.18 g (9.1 m mol) |
| azobisisobutylonitrile (AIBN) | 324 mg (2 m mol, 2 mol %) |
| toluene | 20 ml |

After 5 hours stirring, the reaction mixture was added dropwise 4 l of hexane while stirring. The precipitated polymer was separated, filtered with a glass filter and dried at 30° C. under 0.1 mmHg for 6 hours. The polymer was dissolved in 15 ml of tetrahydrofuran, which was reprecipitated in 3 l of hexane, filtered and dried at 30° C. under 0.1 mmHg for 16 hours.

The yield of the copolymer was 17 g (80%). The copolymer had a weight average molecular weight of 74000 and the dispersion was 1.73. The copolymer was 90:10 copolymer of 4-tert-butylcarbonyloxystyrene and 2-hydroxyethyl methacrylate.

100 parts by weight of the obtained copolymer was added with 1 part by weight of benzoin tosylate and dissolved in ethyl lactate to form a 12% resist solution.

The resist solution was spin-coated on a hexamethyldisilazane (HMDS)-treated Si substrate and baked at 100° C. for 20 minutes to form a resist layer 1 μm thick.

The resist layer was exposed using an electron beam at an acceleration voltage of 20 kV and then developed with a 2.38% tetramethylammoniumhydroxide (TMAH) aqueous solution for 60 seconds.

As a result, the resist patterns of the 0.6 μm line-and-space patterns were resolved and the sensitivity was 2.3 μC/cm$^2$.

The same resist solution was coated on a Si substrate that was not treated with HMDS and processed in the same manner as above. The results were similar to the above and the resist patterns were not peeled off.

We claim:

1. A process for forming a resist pattern, comprising the steps of:

coating a chemically amplified resist composition on a substrate, said chemically amplified resist composition comprising 100 parts by weight of a copolymer of a first monomer unit having a recurrent acid labile pendant group to change the polarity of the polymer and a second monomer unit of methacrylate represented by the following formula:

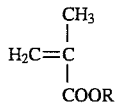

where R stands for an alkyl group containing 2 to 4 carbon atoms and having one hydroxyl group, and 1 to 20 parts by weight of a photo acid generator, selectively exposing the coated chemically amplified resist composition with a light or an electron beam, to form a latent image in the coated chemically amplified resist composition, and developing the latent image in the exposed coated chemically amplified resist composition with an alkali-solution to form a resist pattern, in which an inhibition layer does not appear on the surface of the developed resist pattern.

2. A process according to claim 1, wherein said second monomer is contained in an amount of 1% to 30% by mole of said copolymer.

3. A process for forming a resist pattern, comprising the steps of:

coating a chemically amplified resist composition on a substrate, said chemically amplified resist composition comprising 100 parts by weight of a copolymer of a first monomer unit having a recurrent acid labile pendant group to change the polarity of the polymer and a second monomer unit represented by one formula selected from the group consisting of the following formulae:

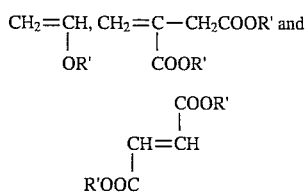

wherein R' stands for hydrogen or methyl, selectively exposing the coated chemically amplified resist composition with a light or an electron beam, to form a latent image in the coated chemically amplified resist composition, and developing the latent image in the exposed coated chemically amplified resist composition with an alkali-solution to form a resist pattern, in which an inhibition layer does not appear on the surface of the developed resist pattern.

4. A process according to claim 3, wherein said second monomer is contained in an amount of 1% to 30% by mole of said copolymer.

* * * * *